US006838690B2

(12) United States Patent
Shoji

(10) Patent No.: US 6,838,690 B2
(45) Date of Patent: Jan. 4, 2005

(54) METHOD AND APPARATUS FOR RECORDING AND READING OUT AN ELECTROSTATIC LATENT IMAGE

(75) Inventor: Takashi Shoji, Kaisei-machi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 140 days.

(21) Appl. No.: 10/156,201

(22) Filed: May 29, 2002

(65) Prior Publication Data

US 2002/0179868 A1 Dec. 5, 2002

(30) Foreign Application Priority Data

May 30, 2001 (JP) ........................................ 2001-162540

(51) Int. Cl.[7] .............................. G01T 1/00; G01T 1/24
(52) U.S. Cl. ..................................... 250/580; 250/591
(58) Field of Search ............................... 250/580, 591, 250/370.08, 370.09, 370.12, 370.11; 257/431; 430/58.1, 57.1, 57.8, 59.1

(56) References Cited

U.S. PATENT DOCUMENTS

| 4,535,468 | A | | 8/1985 | Kempter | |
| 5,101,255 | A | * | 3/1992 | Ishioka et al. | 257/52 |
| 5,196,702 | A | * | 3/1993 | Tsuji et al. | 250/591 |
| 5,508,507 | A | * | 4/1996 | Nelson et al. | 250/214 LA |
| 5,994,713 | A | * | 11/1999 | Becker et al. | 250/591 |
| 6,268,614 | B1 | * | 7/2001 | Imai | 250/591 |
| 6,373,063 | B1 | * | 4/2002 | Imai | |
| 6,437,339 | B2 | * | 8/2002 | Lee et al. | 250/370.09 |

FOREIGN PATENT DOCUMENTS

| EP | 898421 A2 | * | 2/1999 | ............ H04N/5/30 |
| EP | 1 041 400 A2 | | 10/2000 | |
| EP | 1 041 401 A2 | | 10/2000 | |
| JP | 11-194546 | * | 7/1999 | |
| JP | 2000-105297 | * | 4/2000 | |
| JP | 2000-105397 | | 4/2000 | |
| JP | 2000-284056 | | 10/2000 | |
| JP | 2000-284057 | | 10/2000 | |

OTHER PUBLICATIONS

Humbert de Monts, et al. "A New Photoconductor Imaging System for Digital Radiography," Medical Physics, vol. 16, No. 1, pp. 105–109, Jan.–Feb., 1989.

* cited by examiner

Primary Examiner—Albert Gagliardi
(74) Attorney, Agent, or Firm—Sughrue Mion, PLLC

(57) ABSTRACT

An apparatus includes: a switch for switching voltage application from a power source to a detector; a voltage generator for supplying high voltage to a radiation source; and a control means for controlling a light source control means. When a control signal input to the switch is set to low voltage and an electrode of a first conductive layer and a stripe electrode are set at same potential, the control means sets control signal input to the light source control means to low voltage, making a planar light source emit preexposure light to perform empty reading, wherein preexposure light is irradiated onto a reading photoconductive layer. After irradiation of preexposure light and empty reading is stopped, radiation is irradiated onto the first conductive layer while recording voltage causing avalanche amplification is applied between the first conductive layer and the stripe electrode, thereby recording an electrostatic latent image in the detector.

6 Claims, 2 Drawing Sheets

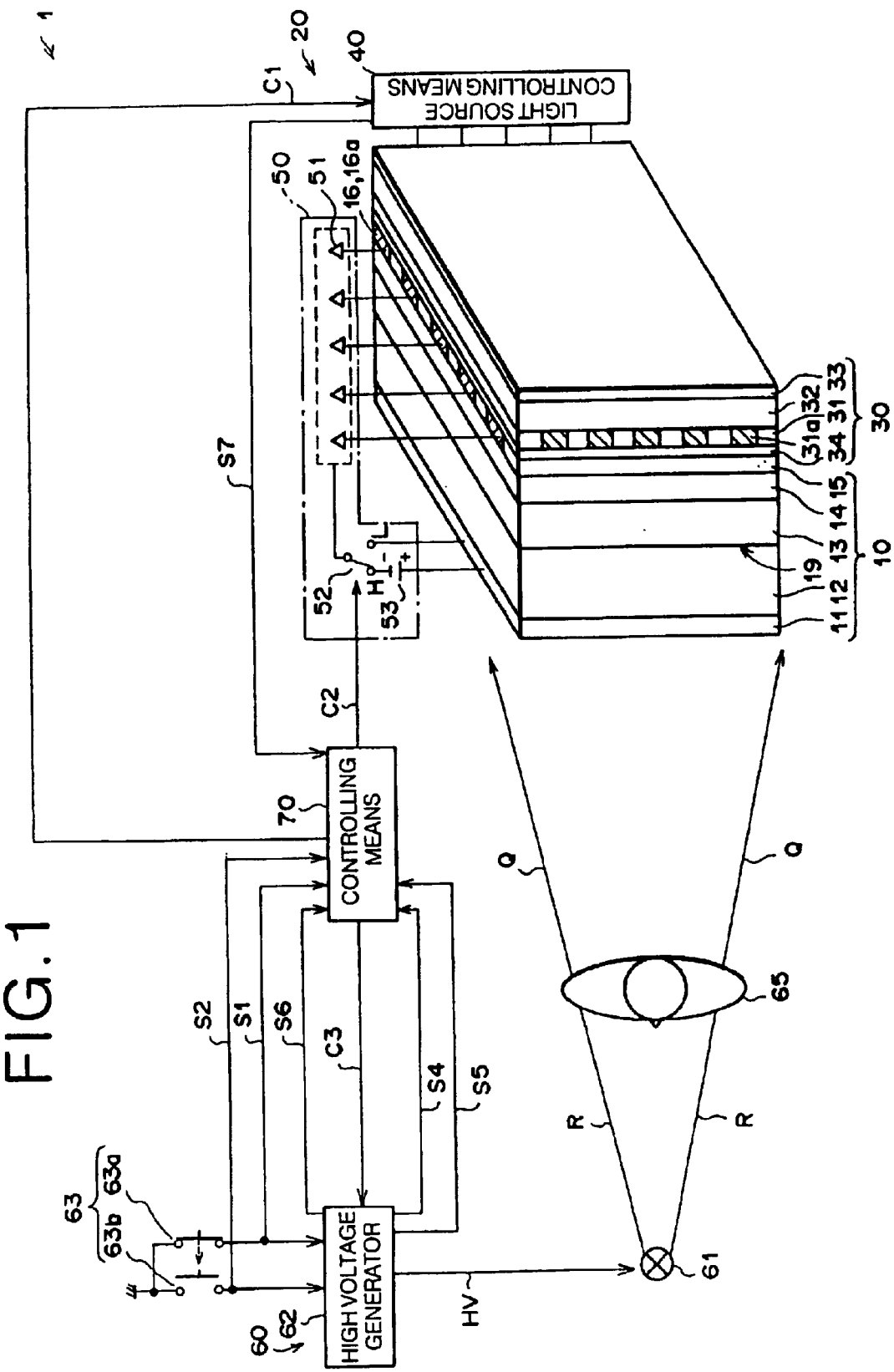

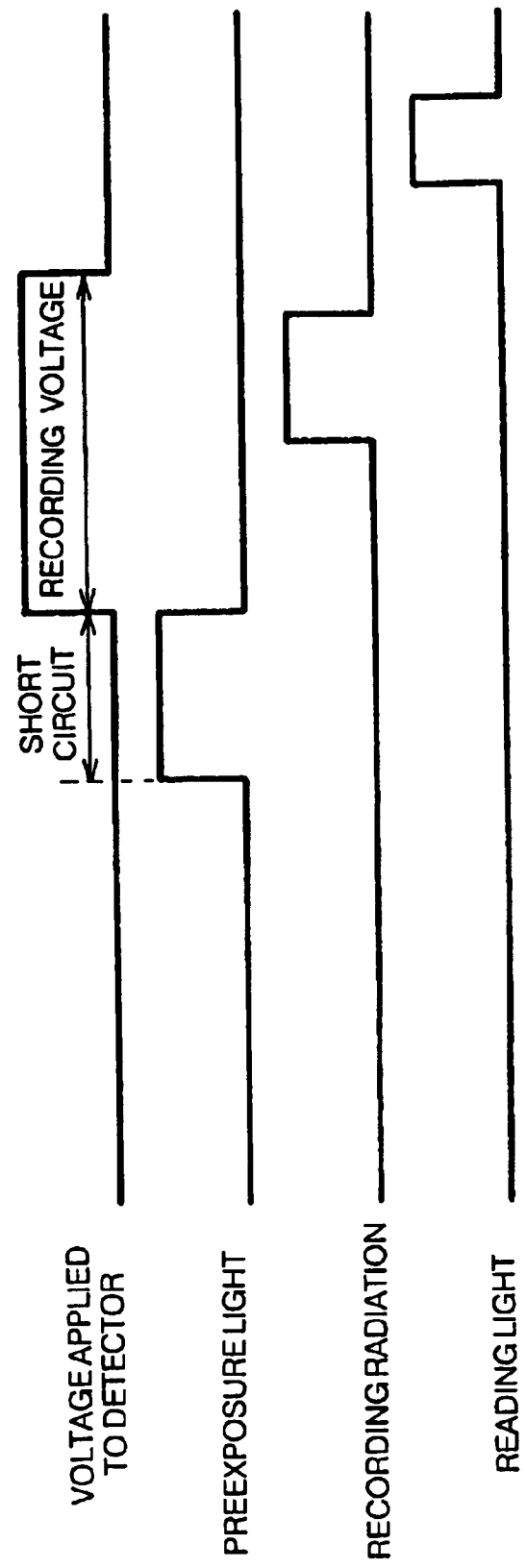

METHOD AND APPARATUS FOR RECORDING AND READING OUT AN ELECTROSTATIC LATENT IMAGE

BACKGROUND OF THE INVENTION

1. Field of the Invention

The present invention relates to a method and an apparatus for recording and reading out an electrostatic latent image, in which intensity distribution information of recording light is recorded as an electrostatic latent image on an electrostatic recording body.

2. Description of the Related Art

Heretofore, in medical X-ray imaging and the like, there has been known a system to be described below for reading an electrostatic latent image borne by latent image charges, that is, radiation image information. In the system, in order to decrease a radiation dosage received by a subject, to improve the diagnosis performance, and so on, a photoconductor sensitive to X-rays, for example, a selenium plate composed of amorphous selenium (a-Se), is used as an electrostatic recording body (photoconductor, solid state radiation detector). Then, recording radiation such as an X-ray bearing the radiation image information is irradiated onto this electrostatic recording body, and the latent image charges bearing the radiation image information is stored in a capacitor of the electrostatic recording body. Then, the electrostatic recording body is scanned by reading light (reading electromagnetic wave) such as a laser beam, and thus a current generated in the electrostatic recording body is detected through plane electrodes or comb electrodes on both sides of the electrostatic recording body.

In this system, the electrostatic recording body having electrodes on both of its ends and at least one photoelectric conductive layer provided therebetween is used. The recording radiation is irradiated onto the electrostatic recording body in a state where a recording voltage is applied to both of its end electrodes, and the electrostatic latent image is formed in the capacitor of the electrostatic recording body. Then, the electrodes at both ends of the electrostatic recording body are short-circuited to be set at the same potential. Further, the photoelectric conductive layer of the electrostatic recording body is scanned by means of reading light through an electrode having a transmittivity thereto (hereinafter referred to as a reading light side electrode). Thus, electric reading of the electrostatic latent image is carried out by photoinduced discharge by means of pairs (charge pairs) of electrons and holes, which are generated on an interface between the reading light side electrode and the photoelectric conductive layer. In this system, during reading of the electrostatic latent image, no current flows in the dark portions of the image, and larger currents flow in the lighter portions of the image. The system as described above, in which the electrodes at both ends of the electrostatic recording body are short-circuited after recording and larger currents flow in the lighter portions of the image, is referred to as a positive type system. The electrostatic recording body for use in this positive type system is referred to as a positive type electrostatic recording body.

As specific layer configurations of the positive type electrostatic recording body as described above, for example, there are ones to be described below. One composed of: a first conductive layer (recording light side conductive layer; the same applies to the following); a recording photoconductive layer; a trap layer as a capacitor; a reading photoconductive layer; and a second conductive layer (reading light side conductive layer; the same applies to the following) (U.S. Pat. No. 4,535,468 and the like). One composed of: a first conductive layer; a recording/reading photoconductive layer; and a second conductive layer, in which a capacitor is formed on an interface between the photoconductive layer and the second conductive layer (Medical Physics, Vol. 16, No. 1, January/February 1989; P105–109). One composed of: a first conductive layer; an insulating layer; a recording/reading photoconductive layer; and a second conductive layer, in which a capacitor is formed on an interface between the insulating layer and the photoconductive layer, and so on. Note that the first and second conductive layers are layers corresponding to the aforementioned electrodes at both ends.

Moreover, there has been proposed, as a positive type electrostatic recording body, one composed by stacking in the following order: a first conducting layer having a transmittivity to recording radiation; a recording photoconductive layer exhibiting a photoconductivity by receiving irradiation of the recording radiation; a charge transport layer functioning as an approximate insulator for charges of the same polarity as that of the charges charged on the first conductive layer and functioning as an approximate conductive layer for charges of a polarity reverse to that of the charges of the same polarity; a reading photoconductive layer exhibiting a photoconductivity by receiving irradiation of reading light (reading electromagnetic wave); and a second conductive layer having a transmittivity to the reading light, in which a capacitor is formed on an interface between the recording photoconductive layer and the charge transport layer (Japanese Unexamined Patent Publications Nos. 2000-105297, 2000-284056 and 2000-284057).

However, any of the positive type electrostatic recording bodies has a problem of so-called photovoltaic noise, in which a current flows by irradiation of the reading light even if a barrier electric field is formed on the interface between the second conductive layer having the transmittivity to the reading light and the photoconductive layer composed of a-Se or the like and a dosage of the recording radiation is in a range of 0 mR.

Moreover, in the photoconductive layer of the electrostatic recording body, though a high-resistant amorphous substance such as a-Se having traps is generally used, the following problem is inherent. From application of a voltage (generally a high voltage) between the electrodes at both ends (first and second conductive layers) of the electro static recording body to short circuit the end electrodes, charge injection occurs from the electrodes to the photoconductive layer. While the majority of injected charges are trapped as space charges, some of the charges are not trapped as space charges, and a dark current flows as a leakage current in the photoconductive layer. This dark current is stored as a dark latent image in the capacitor and emerges as a dark latent image noise in a reproduced image when being read. This dark current has a characteristic that it is large at the beginning of voltage application, decreases with time, and approaches a certain leakage current value. Specifically, a dark current level immediately after the voltage application is larger than a dark current level in a stabilized state (stabilized leakage current state). This phenomenon is more prominent as the applied voltage is higher, and in some cases, it may take, for example, 10 minutes or longer to stabilize the dark current level to the leakage current level. Furthermore, the dark current level exhibits the following tendency. Even if the dark current level is stabilized once, if the voltage application is halted for a while after the short circuit of the both electrodes, the dark current level returns to the original magnitude immediately after another voltage application performed thereafter. Hence, the dark latent image caused by the high-level dark current immediately after the voltage application becomes a large noise source when the reproduce image is read. Furthermore, a quantity of this dark latent image is varied with time from the voltage application to the irradiation of the recording radiation and with usage history. Therefore, it is also difficult to correct image data so that the dark latent image noise does not emerge on the reproduced image.

Meanwhile, there has been proposed in the above-described Japanese Unexamined Patent Publication No. 2000-105297, a method for preventing image quality deterioration, in which preexposure light is irradiated onto the reading photoconductive layer during the voltage application and before the irradiation of the recording radiation, and the dark latent image and a residual image, which are stored in the capacitor before the irradiation of the recording radiation, are decreased by utilizing the rectifying action of the charge transport layer.

Furthermore, the has also been proposed a method for decreasing photovoltaic noise, in which barriers between the charge transport layer and the recording photoconductive layer are adequately provided to somewhat form hole barriers, and the holes are stored in the hole barriers by the preexposure to make the voltage flat-band.

However, these methods are established only in the electrostatic recording body including the charge transport layer, which is described in the gazette of Japanese Unexamined Patent Publication No. 2000-105297, and the method described in the gazette of Japanese Unexamined Patent Publication No. 2000-105297 cannot be applied to the other electrostatic recording bodies described above.

Moreover, it is not easy to form hole barriers to an extent of exactly canceling the photovoltaic on the interface between the charge transport layer and the recording photoconductive layer.

Furthermore, in the case where the dark current from the reading light side electrode is originally large, and the dark latent image of the polarity reverse to that of the electrostatic latent image is formed in the capacitor, the above-described preexposure rather increases the dark latent image.

Therefore, there has been proposed in Japanese Patent Application No. 11 (1999)-194546, a method and an apparatus for recording an electrostatic latent image, which are capable of achieving the decrease of the photovoltaic noise and stabilization thereof and achieving the decrease of the dark latent image formed immediately after the voltage application and stabilization thereof in the case of using the optical reading system and the positive type electrostatic recording body. In the above-described method and apparatus, empty reading is carried out, in which the preexposure light is irradiated onto the photoconductive layer in a state where the electrode of the first conductive layer and the electrode of the second conductive layer are set at the same potential, and after the empty reading is stopped, the recording radiation is irradiated in a state where the recording voltage is applied between both electrodes to record the electrostatic latent image.

SUMMARY OF THE INVENTION

The present invention was invented for further improving the S/N ratio in the above method and apparatus described in Japanese Patent Application No. 11 (1999)-194546. The object of the present invention is to provide a method and an apparatus for recording an electrostatic latent image, which are capable of achieving the improvement of the S/N ratio in the case of using the optical reading system and the positive type electrostatic recording body.

The method for recording and reading out an electrostatic latent image according to the present invention is a method for recording and reading out an electrostatic latent image, in which intensity distribution information of recording light is recorded as an electrostatic latent image in a capacitor of an electrostatic recording body composed by stacking in the following order: a first conducting layer having a transmittivity to recording light; a recording photoconductive layer exhibiting a photoconductivity by receiving irradiation of the recording light; a capacitor for storing charges in a quantity in response to a light quantity of the recording light as latent image charges; a reading photoconductive layer exhibiting a photoconductivity by receiving irradiation of the reading light; and a second conductive layer having a transmittivity to the reading light, the method comprising the steps of: applying a voltage between the first conductive layer and the second conductive layer, the voltage causing avalanche amplification in the recording photoconductive layer; recording the electrostatic latent image in a state where the voltage is applied between the first conductive layer and the second conductive layer; and reading out the electrostatic latent image with no potential applied between the first conductive layer and the second conductive layer.

The electrostatic recording body for use in the present invention has the first conductive layer, the recording photoconductive layer, the reading photoconductive layer and the second conductive layer in this order, and is composed by forming the capacitor between the recording photoconductive layer and the reading photo conductive layer. The electrostatic recording body maybe composed by further stacking other layers or a micro conductive member (microplate).

Moreover, the apparatus for recording and reading out an electrostatic latent image according to the present invention is an apparatus for recording and reading out an electrostatic latent image, the apparatus being provided with an electrostatic recording body composed by stacking in the following order a first conductive layer having a transmittivity to recording light; a recording photoconductive layer exhibiting a photoconductivity by receiving irradiation of the recording light; a capacitor for storing charges in a quantity in response to a light quantity of the recording light as latent image charges; a reading photoconductive layer exhibiting a photoconductivity by receiving irradiation of the reading light; and a second conductive layer having a transmittivity to the reading light, in which intensity distribution information of recording light is recorded as an electrostatic latent image in the capacitor of the electrostatic recording body, the apparatus comprising: voltage applying means for applying a voltage between the first conductive layer and the second conductive layer, the voltage causing avalanche amplification in the recording photoconductive layer.

In the apparatus for recording and reading out an electrostatic latent image according to the present invention, it is desirable that the recording photoconductive layer be formed with amorphous selenium as its main component.

According to the method and apparatus for recording and reading out an electrostatic latent image according to the present invention, the voltage causing avalanche amplification in the recording photoconductive layer is applied between the first conductive layer and the second conductive layer. Thus, even in the case where the quantity of charge pairs (number of signal photons) generated by incidence of the recording light is small, it is possible to amplify the quantity of generated charges due to the avalanche amplification function. Therefore, a sufficiently large signal can be obtained, and a ratio of the light current and the dark current is increased to make it possible to obtain a signal with a good S/N ratio.

BRIEF DESCRIPTION OF THE DRAWINGS

FIG. 1 is a schematic view of an apparatus for imaging and reading a radiation image, to which a method and an apparatus for recording an electrostatic latent image according to one embodiment of the present invention is applied.

FIG. 2 is a timing chart explaining a function in the embodiment shown in FIG. 1.

DESCRIPTION OF THE PREFERRED EMBODIMENTS

Hereinafter, description will be made in detail for an embodiment of the present invention with reference to the drawings. FIG. 1 is a schematic view of an apparatus for imaging and reading a radiation image, to which an apparatus for recording an electrostatic latent image according to the present invention is applied.

As shown in FIG. 1, an radiation image imaging/reading apparatus 1 includes: a solid state radiation detector (hereinafter, simply referred to as a detector) 10 as an electrostatic recording body; a planar light source 30 stacked on the detector 10; a reading unit 20 composed of a light source controlling means 40 for controlling the planar light source 30 and a current detection circuit 50 for reading charges of the detector 10; a radiation irradiation unit 60; and a controlling means 70 connected to the current detection circuit 50 and the radiation irradiation unit 60.

Note that a part of the electrostatic latent image recording apparatus is composed of: the detector 10; a voltage applying means to be described later in the current detection circuit 50; the radiation irradiation unit 60; and the controlling means 70.

The detector 10 is an electrostatic recording body of an improved direct conversion system (direct conversion and optical reading system), which is described in Japanese Patent Application No. 11 (1999)-194546. The detector 10 is composed by stacking in the following order: a first conductive layer 11 having a transmittivity to radiation for recording to be described later; a recording photoconductive layer 12 exhibiting a conductivity by receiving irradiation of the radiation transmitted through the first conductive layer 11; a charge transport layer 13 functioning substantially as an insulator for charges charged in the conductive layer 11 and functioning substantially as an conductor for charges of a polarity reverse to that of the charges; a reading photoconductive layer 14 exhibiting a conductivity by receiving irradiation of a reading electromagnetic wave to be described later; and a second conductive layer 15 having a transmittivity to the reading light.

Here, for the recording photoconductive layer 12, amorphous selenium is used.

Moreover, the second conductive layer 15 is composed by arraying a large number of linear electrodes (oblique line portion in the drawing) in a stripe shape. Hereinafter, the electrode of the second conductive layer 15 will be referred to as a stripe electrode 16, and each linear electrode will be referred to as an element 16a.

The planar light source 30 is an EL light emitting body composed of a conductive layer 31; an EL layer 32; and a conductive layer 33. The planar light source 30 is stacked on the detector 10 as described above. An insulating layer 34 is provided between the stripe electrode 15 of the detector 10 and the conductive layer 31. The conductive layer 31 is composed by arraying a large number of linear elements (oblique line portion in the drawing) 31a in a stripe shape. The elements 31a are arrayed so as to intersect the elements 16a of the stripe electrode 16 of the detector 10 (approximately perpendicularly in this example). Thus, a configuration is made, in which a large number of linear light sources formed of the elements 31a are arrayed in a planar shape. The respective elements 31a are connected to the light source controlling means 40.

The light source controlling means 40 applies a specified voltage between the elements 31a and the conductive layer facing thereto. The light source controlling means 40 applies voltages to the elements 31a individually during reading, and applies voltages simultaneously to a plurality or the entirety of the elements 31a during preexposure. For example, if a specified direct current is applied between each element 31a and the conductive layer 33 while sequentially switching the elements 31a, then EL light is emitted from the EL layer 32 sandwiched by the elements 31a and the conductive layer 33. The EL light having been transmitted through the elements 31a is utilized as line-shaped reading light (hereinafter referred to as line light). Specifically, the planar light source 30 is equivalent to one in which line-shaped micro light sources are arrayed in large number in a plane shape. El light emission is carried out by sequentially switching the elements 31a for the entirety thereof from one end to the other end in the longitudinal direction of the stripe electrode 16, and thus the entire surface of the stripe electrode 16 is electrically scanned by means of the line light. Note that the longitudinal direction of the elements 16a correspond to the sub-scanning direction, and the extended direction of the line light corresponds to the main scanning direction.

Meanwhile, if voltages are applied to the plurality or the entirety of the elements 31a simultaneously, then, by this voltage application, the EL light is emitted approximately evenly over the entire surface of the stripe electrode 16 from the EL layer 32. This EL light is utilized as the preexposure light or exposure light irradiated when a voltage is applied to the detector 10 (hereinafter referred to as simultaneous exposure light). Specifically, the planar light source 30 functions not only as a reading light source but also as a light source for the preexposure or exposure during empty voltage application to be described later (hereinafter referred to as simultaneous exposure).

A control signal C1 is inputted to the light source controlling means 40, which is set in the preexposure mode of emitting the EL light as the preexposure light and the simultaneous exposure light when the control signal C1 is L (low), and is set in the reading light mode of emitting the EL light as the reading light when the control signal C1 is H (high). When the control signal C1 is in a high impedance state, the EL light is not emitted from the planar light source 30.

The current detection circuit 50 has a large number of current detection amplifiers 51 connected to inverting input terminals, each current detection amplifier 51 corresponding to each element 16a of the stripe electrode 16. In this embodiment, the recording photoconductive layer 12 is formed of amorphous selenium. However, the avalanche amplification in amorphous selenium is a phenomenon occurring only when the carriers are holes. Therefore, in the recording photoconductive layer 12, in order to form an electric field in a direction where the holes as the carriers move toward the capacitor 19, a positive electrode of a power supply 53 is connected to the first conductive layer 11 of the detector 10, and a negative electrode of the power supply 53 is connected to one input of a switch 52. The other input of the switch 52 is connected to the first conductive layer 11 of the detector 10. Note that the switch 52 and the power supply 53 constitute the voltage applying means according to the present invention.

Output of the switch 52 is commonly connected to non-inverting input terminals of unillustrated operational amplifiers constituting respective current detection amplifiers 51. The line light as the reading light is irradiated from the planar light source 30 onto the stripe electrode 16 side (i.e., scanning exposure). Thus, the respective current detection amplifiers 51 detect the currents flowing in the respective elements 16a simultaneously (in parallel) for the respective elements 16a connected thereto.

Note that, though detailed description for the configuration of the current detection amplifiers 51 is omitted, it is possible to apply well-known configurations in various ways. It is a matter of course that the connection mode among the switch 52, the power supply 53 and the respective elements 16a is different from that of the above depending on the configuration of the current detection amplifiers 51.

The radiation irradiation unit 60 is composed of: a radiation source 61 for generating radiation R; a high voltage generator 62 for generating power for driving the radiation source 61; and a switch 63 for controlling imaging, which is connected to the high voltage generator 62. The switch 63 is made as a two-step switch composed of switches 63a and 63b. The switch 63 is configured in such a manner that the switch 63b is not turned on unless the switch 63a is turned on.

Note that, in order to perform a function to be described later automatically at specified timing, the following configuration is adopted. To the controlling means 70, there are inputted signals S1 and S2 from the switches 63a and 63b, a standby signal S4 from the high voltage generator 62, an irradiation termination signal S5 indicating irradiation termination of the recording radiation, a signal S6 indicating an irradiation time of the set recording irradiation, and an irradiation termination signal S7 indicating irradiation termination of the preexposure light from the light source controlling means 40. Moreover, from the controlling means 70, there are outputted a control signal C1 to the light source controlling means 40, a control signal C2 to the switch 52, and a control signal C3 to the high voltage generator 62.

When the control signal C2 is H, the switch 52 is switched to the power supply 53 side, and a direct current is applied from the power supply 53 to the detector 10 (specifically, between the electrode of the first conductive layer 11 and the stripe electrode 16). Meanwhile, when the control signal C2 is L, the switch 52 is switched to the first conductive layer 11 side, the electrode of the first conductive layer 11 and the stripe electrode 16 are substantially short-circuited through an imaginary short of the operational amplifiers (not shown) constituting the current detection amplifiers 51, and the both electrodes are set at the same potential. Moreover, when the control signal C2 is in a high impedance state, the switch 52 is set at a midpoint, the positive electrode of the power supply 53 is turned in a floating state, and the voltage application to the detector 10 is not carried out, or the electrodes at both ends are not set at the same potential. When the control signal C3 of a high (H) voltage is inputted, the high voltage generator 62 supplies a high voltage HV to the radiation source 61 and allows the radiation source 61 to generate the radiation R.

Hereinafter, description will be made of the operation of the radiation image imaging/reading apparatus 1 configured as described above.

First, the recording voltage is applied to the recording photoconductive layer 12 so that the avalanche amplification function can operate therein. In this embodiment, the recording photoconductive layer 12 is formed of amorphous selenium. However, the avalanche amplification in amorphous selenium is a phenomenon occurring only when the carriers are holes. Therefore, in the recording photoconductive layer 12, an electric field is formed in a direction where the holes as the carriers move toward the capacitor 19, and the recording voltage is set at a voltage capable of applying an electric field of intensity of about 100 V/$\mu$m to the recording photoconductive layer 12. Thus, the avalanche amplification function comes to operate in the recording photoconductive layer 12. Accordingly, it becomes possible to amplify the quantity of generated charges, and a sufficiently large signal can be obtained. Simultaneously, a ratio of the light current and the dark current can be increased, and the signal with a good S/N ratio can be obtained.

Radiation Q as the recording light is irradiated onto the first conductive layer 11 in the application state of the recording voltage, and the electrostatic latent image is recorded in the detector 10. Specifically, so that the charges generated in the recording photoconductive layer 12 in the detector 10 can be first stored in the capacitor 19, the switch 52 is switched to the power supply 53 side, and there is applied, between the electrode of the first conductive layer 11 and the stripe electrode 16 from the power supply 53, a direct voltage of a specified magnitude as the recording voltage, for example, a voltage capable of applying an electric field of intensity of about 100 V/$\mu$m to the recording photoconductive layer 12. Thus, both the electrode of the first conductive layer 11 and the stripe electrode 16 are charged.

After this application of the recording voltage, the high voltage HC is supplied from the high voltage generator 62 to the radiation source 61, and the radiation R is irradiated from the radiation source 61. This radiation R is irradiated on an imaged subject 65, and the recording radiation Q bearing radiation image information of the imaged subject 65, which has transmitted therethrough, is irradiated onto the detector 10 for a set irradiation time, and thus positive and negative charge pairs are generated in the recording photoconductive layer 12 of the detector 10. In this case, the voltage is applied so that the avalanche amplification function can operate between the electrode of the first conductive layer 11 and the stripe electrode 16, and therefore, generation of the positive and negative charge pairs is radically increased in the photoconductors.

The recording voltage is applied between the electrode of the first conductive layer 11 and the stripe electrode 16. Therefore, the negative charges in the generated charge pairs are concentrated along specified electric field distribution to the respective elements 16a of the stripe electrode 16, and are stored as latent image charges in the capacitor 19 as the interface between the recording photoconductive layer 12 and the charge transport layer 13. Since the quantity of the latent image charges is approximately proportional to the irradiated radiation dosage, these latent image charges bear the electrostatic latent image. Meanwhile, the positive charges generated in the recording photoconductive layer 12 are attracted to the first conductive layer 11, recombined with negative charges injected from the power supply 53, and quenched.

Next, when the electrostatic latent image is read out of the detector 10, the control signal C1 is first set to H (reading light mode), then the switch 52 is connected to the first conductive layer 11 of the detector 10. Then, a specified direct voltage is applied between the respective elements 31*a* and the conductive layer 33 while sequentially switching the elements 31*a* by the light source controlling means 40, and the entire surface of the detector 10 is electrically scanned by the line light emitted from the EL layer 32.

The positive and negative charge pairs are generated in the photoconductive layer 14 onto which the line light corresponding to the sub-scanning position is incident by the scanning using the line light. The positive charges thereamong radically move in the charge transport layer 13 so as to be attracted to the negative charges (latent image charges) stored in the capacitor 19. Then, the positive charges are recombined with the latent image charges in the capacitor 19 and are quenched. Meanwhile, the negative charges generated in the photoconductive layer 14 are recombined with positive electrodes injected from the power supply 53 to the stripe electrode 16 and are quenched. As described above, the negative charges stored in the capacitor 19 of the detector 10 are quenched by the charge recombination, and the current by charge movement at this charge recombination is generated in the detector 10. The respective current detection amplifiers 51 connected to the corresponding elements 16*a* detect this current simultaneously. The current flowing in the detector 10 at the reading corresponds to the latent image charges, that is, the electrostatic latent image. Therefore, by detecting this current, the intensity distribution information of the recording light, that is, the image information can be acquired.

Next, description will be made of a comparison in the quantities of detected charges between the case where the recording voltage is set at a voltage causing the avalanche amplification function and the case where the recording voltage is set at a conventional voltage.

A sensor size of the electrostatic recording body was set as 180 mm×240 mm, and a pixel pitch thereof was set as 100 $\mu$m×100 $\mu$m. As the recording photoconductive layer, one was used, which is formed mainly of amorphous selenium, has a thickness of 200 $\mu$m. As the reading photoconductive layer 14, one was used, which is formed mainly of amorphous selenium, has a thickness of 10 $\mu$m and was provided with no schintillator. A voltage applied to the electrostatic recording body was set at 21 kV (voltage causing the avalanche amplification function) and 2.1 kV (voltage not causing the avalanche amplification function).

Moreover, mammography imaging was carried out. As an imaging condition, a Mo bulb of an X-ray tube voltage of 25 kV was used, and an X-ray dosage was set at 100 mR.

As a result, the quantity of detected charges in the case at the recording voltage of 21 kV became 100 times as much as that in the case at the conventional recording voltage of 2.1 kV, and the S/N ratio was significantly improved. Moreover, though uneven film thickness of the photoconductive layer changed an avalanche amplification rate spatially to cause shading, calibration was made beforehand to correct the gain, and thus good image quality was obtained.

Note that, as shown in FIG. 2, the empty reading is carried out, in which the preexposure light is irradiated onto the photoconductive layer in a state where the electrode of the first conductive layer 11 and the stripe electrode 16 are set at the same potential, and after the empty reading is stopped, the recording radiation is irradiated in a state where the recording voltage is applied between the both electrodes to record the electrostatic latent image. In this case, a light-induced fatigue state (trap storage state) is temporarily formed on the light incident interface (electron/hole pair forming area), onto which the preexposure light is irradiated. Thus, the photovoltaic noise that may possibly occur when the reading light is irradiated is decreased and stabilized by the light-induced fatigue state, which is more desirable.

Moreover, prior to the empty reading, if the empty voltage application is carried out, in which a voltage of a specified magnitude and a specified polarity is applied for a specified time between the both electrodes, then a stabilized high-resistant space charge state is formed in the photoconductive layer or on an interface between the photoconductive layer and the electrode, and in addition, a state where the storage of the dark latent image is a little is realized in the capacitor. Therefore, immediately after applying the recording voltage, as heretofore, the possibility of causing the dark latent image noise at high level is eliminated, and the dark latent image noise is decreased and stabilized, which is more desirable.

Moreover, as the recording light, besides the radiation, an electromagnetic wave having a wavelength of equal to/less than 550 nm may be used. Furthermore, for the recording photoconductive layer, not being limited to amorphous selenium, any film may be used as long as it is a film causing the avalanche amplification. Furthermore, for the second conductive layer, not the stripe electrode but a single electrode may be formed, and one-dimensional information may be detected.

What is claimed is:

1. A method for recording and reading out an electrostatic latent image, in which intensity distribution information of recording light is recorded as an electrostatic latent image in a capacitor of an electrostatic recording body composed by stacking in a following order:

a first conductive layer having a transmittivity to recording light;

a recording photoconductive layer exhibiting a photoconductivity by receiving irradiation of the recording light;

a capacitor for storing charges in a quantity in response to a light quantity of the recording light as latent image charges;

a reading photoconductive layer exhibiting a photoconductivity by receiving irradiation of the reading light; and a second conductive layer having a transmittivity to the reading light, the method comprising the steps of:

applying a voltage between the first conductive layer and the second conductive layer, the voltage causing avalanche amplification in the recording photoconductive layer;

recording the electrostatic latent image in a state where the voltage is applied between the first conductive layer and the second conductive layer; and short circuiting the first and second conductive layers during readout of the electrostatic latent image.

2. An apparatus for recording and reading out an electrostatic latent image, the apparatus being provided with an electrostatic recording body composed by stacking in a following order:

a first conductive layer having a transmittivity to recording light;

a recording photoconductive layer exhibiting a photoconductivity by receiving irradiation of the recording light;

a capacitor for storing charges in a quantity in response to a light quantity of the recording light as latent image charges;

a reading photoconductive layer exhibiting a photoconductivity by receiving irradiation of the reading light; and a second conductive layer having a transmittivity to the reading light, in which intensity distribution information of recording light is recorded as an electrostatic latent image in the capacitor of the electrostatic recording body, the apparatus comprising:

voltage applying means for applying a voltage between the first conductive layer and the second conductive layer, the voltage causing avalanche amplification in the recording photoconductive layer; and a short circuiting means for short circuiting the first and second conductive layers.

3. The apparatus for recording and reading out an electrostatic latent image according to claim 2, wherein the recording photoconductive layer is formed with amorphous selenium as its main component.

4. A method for recording and reading out an electrostatic latent image, in which intensity distribution information of recording light is recorded as an electrostatic latent image in an electrostatic recording body composed by stacking in a following order: a first conductive layer; a recording photoconductive layer; a charge transport layer, a reading photoconductive layer, and a second conductive layer, the method comprising the steps of:

applying a voltage between the first conductive layer and the second conductive layer, wherein the voltage causes avalanche amplification in the recording photoconductive layer;

recording the electrostatic latent image in a state where the voltage is applied between the first conductive layer and the second conductive layer; and short circuiting the first and second conductive layers during readout of the electrostatic latent image.

5. An apparatus for recording an electrostatic latent image, the apparatus being provided with an electrostatic recording body composed by stacking in a following order: a first conductive layer; a recording photoconductive layer; a charge transport layer; a reading photoconductive layer, and a second conductive layer, in which intensity distribution information of recording light is recorded as an electrostatic latent image in the interface between the recording photoconductive layer and the charge transport layer of the electrostatic recording body, the apparatus comprising:

voltage applying means for applying a voltage between the first conductive layer and the second conductive layer, the voltage causing avalanche amplification in the recording photoconductive layer, and a short circuiting means for short circuiting the first and second conductive layers.

6. The apparatus of claim 2, wherein the short circuiting occurring during the reading out of the electrostatic latent image.

* * * * *